(12) United States Patent
Song et al.

(10) Patent No.: US 10,095,069 B2
(45) Date of Patent: Oct. 9, 2018

(54) LIQUID CRYSTAL DISPLAY AND METHOD FOR MANUFACTURING THE SAME

(71) Applicant: Samsung Display Co., Ltd., Yongin, Gyeonggi-Do (KR)

(72) Inventors: Dae Ho Song, Hwaseong-si (KR); Seong Gyu Kwon, Suwon-si (KR); Jae Cheol Park, Hwaseong-si (KR); Kwang Soo Bae, Yongin-si (KR); You Young Jin, Suwon-si (KR)

(73) Assignee: Samsung Display Co., Ltd. (KR)

( * ) Notice: Subject to any disclaimer, the term of this patent is extended or adjusted under 35 U.S.C. 154(b) by 444 days.

(21) Appl. No.: 14/792,241

(22) Filed: Jul. 6, 2015

(65) Prior Publication Data

US 2016/0124256 A1 May 5, 2016

(30) Foreign Application Priority Data

Oct. 30, 2014 (KR) .................. 10-2014-0149351

(51) Int. Cl.
*G02F 1/1341* (2006.01)
*G02F 1/1335* (2006.01)
(Continued)

(52) U.S. Cl.
CPC .......... *G02F 1/1341* (2013.01); *G02F 1/1368* (2013.01); *G02F 1/133377* (2013.01);
(Continued)

(58) Field of Classification Search
CPC ............. G02F 1/133377; G02F 1/1339; G02F 1/1341; G02F 2001/1672; G02F 1/1368;
(Continued)

(56) References Cited

U.S. PATENT DOCUMENTS 6,078,379 A * 6/2000 Nagae ................... G02F 1/1339
349/153
2005/0227166 A1* 10/2005 Ichimura ............... G03F 7/0382
430/270.1
(Continued)

FOREIGN PATENT DOCUMENTS

JP 06-051499 2/1994
JP 09-133806 5/1997
(Continued)

OTHER PUBLICATIONS

EP15187015.1, European search report dated Mar. 15, 2016 (8 pages).
(Continued)

*Primary Examiner* — Sophie Hon
(74) *Attorney, Agent, or Firm* — Innovation Counsel LLP

(57) ABSTRACT

An exemplary embodiment provides a liquid crystal display including: a substrate; a thin film transistor disposed on the substrate; a pixel electrode connected to the thin film transistor; a roof layer disposed to face the pixel electrode; and a capping layer disposed on the roof layer, wherein a plurality of microcavities are disposed between the pixel electrode and the roof layer, the microcavities form a liquid crystal layer including a liquid crystal material, a liquid crystal injection portion is formed between the microcavities, the capping layer is disposed to cover the liquid crystal injection portion, and the capping layer includes a light-blocking material and a water-soluble polymer material.

19 Claims, 14 Drawing Sheets

(51) Int. Cl.
  *H01L 27/12* (2006.01)
  *G02F 1/1368* (2006.01)
  *G02F 1/1333* (2006.01)
(52) U.S. Cl.
  CPC .... *G02F 1/133512* (2013.01); *H01L 27/1259* (2013.01); *G02F 2202/022* (2013.01)
(58) Field of Classification Search
  CPC ......... G02F 1/133512; G02F 2202/022; H01L 27/1259
  USPC .................................. 428/1.5; 349/187–190
  See application file for complete search history.

(56) References Cited

U.S. PATENT DOCUMENTS

| | | | | |
|---|---|---|---|---|
| 2008/0139734 A1* | 6/2008 | Nakashima | ............ | C03C 27/10 524/505 |
| 2008/0257206 A1* | 10/2008 | Rengaswamy | ......... | C09B 31/16 106/31.43 |
| 2012/0062448 A1* | 3/2012 | Kim | .................. | G02F 1/133377 345/55 |
| 2012/0176663 A1 | 7/2012 | Zang et al. | | |
| 2014/0204300 A1 | 6/2014 | Park et al. | | |
| 2014/0198286 A1 | 7/2014 | Lee et al. | | |
| 2014/0267966 A1 | 9/2014 | Won et al. | | |
| 2014/0368781 A1 | 12/2014 | Song et al. | | |

FOREIGN PATENT DOCUMENTS

| | | |
|---|---|---|
| JP | 11-160865 | 6/1999 |
| KR | 101367525 | 2/2014 |
| KR | 1020140031737 A | 3/2014 |
| KR | 1020140058773 A | 5/2014 |
| KR | 1020140090851 | 7/2014 |

OTHER PUBLICATIONS

EP15187015.1 European Search Report (11 pages) dated Jul. 1, 2016.

* cited by examiner

LIQUID CRYSTAL DISPLAY AND METHOD FOR MANUFACTURING THE SAME

CROSS-REFERENCE TO RELATED APPLICATION

This application claims priority to and the benefit of Korean Patent Application No. 10-2014-0149351 filed in the Korean Intellectual Property Office on Oct. 30, 2014, the entire contents of which are incorporated herein by reference.

BACKGROUND (a) Field

The present application relates to a liquid crystal display and a manufacturing method thereof.

(b) Description of the Related Art

A liquid crystal display as one of flat panel display devices that are being widely used includes two display panels, wherein field generating electrodes such as a pixel electrode and a common electrode are formed with a liquid crystal layer interposed therebetween.

The liquid crystal display generates an electric field in a liquid crystal layer by applying a voltage to the field generating electrodes to determine orientations of liquid crystal molecules, also called liquid crystals, of the liquid crystal layer and control polarization of incident light, thereby displaying an image.

A technique of forming a plurality of microcavities in a pixel and filling the microcavities with liquid crystals to implement a display has been developed for one of the liquid crystal displays. Although two sheets of substrates are used in a conventional liquid crystal display, this technique forms constituent elements on one substrate, thereby reducing weight, thickness, and the like of the device.

In a display forming process, liquid crystals may be filled in the microcavities through crystal injection portions, and then the liquid crystal injection portions may be closed and an encapsulation process may be performed to protect all elements.

However, a material employed in the encapsulation process may contact the liquid crystals, thereby contaminating them.

The above information disclosed in this Background section is only for enhancement of understanding of the background and therefore it may contain information that does not form the prior art that is already known in this country to a person of ordinary skill in the art.

SUMMARY

Embodiments have been made in an effort to provide a liquid crystal display, and a manufacturing method thereof, having features of being capable of blocking liquid crystal injection portions without contaminating liquid crystals.

Further, embodiments have been made in an effort to provide a liquid crystal display, and a manufacturing method thereof, having features of including a capping layer made of a material that facilitates a photolithography process.

In addition, embodiments have been made in an effort to provide a liquid crystal display, and a manufacturing method thereof, having features of including a capping layer made of a material that facilitates light blocking.

An exemplary embodiment provides a liquid crystal display including: a substrate; a thin film transistor disposed on the substrate; a pixel electrode connected to the thin film transistor; a roof layer disposed to face the pixel electrode; a capping layer disposed on the roof layer; and a liquid crystal layer disposed between the pixel electrode and the roof layer and formed by a plurality of microcavities, wherein the microcavities comprise a liquid crystal material, wherein a liquid crystal injection portion is formed between the microcavities, the capping layer is disposed to cover the liquid crystal injection portion, and the capping layer includes a light-blocking material and a water-soluble polymer material.

The water-soluble polymer material may include at least one of polyvinyl alcohol (PVA), methoxypolyethylene glycol, polyethylene glycol, polyethylene glycol diacrylate, polyethylene glycol dimethacrylate, and polyvinylpyrrolidone.

The light-blocking material may include a water-soluble black dye or a black pigment.

The water-soluble black dye may include at least one of 2-naphthalenesulfonic acid, trisodium 6-[(7-amino-1-hydroxy-3-sulphonato-2-naphthyl)azo]-3-4-4-amino-6 or 7-sulphonatonaphthyl-azo-phenyl-azo-4-hydroxynaphthalene-2-sulphonate, trisodium 4-amino-3-[[4-[[4-[(2-amino-4-hydroxyphenyl)azo]phenyl]amino]-3-sulphonatophenyl]azo]-5-hydroxy-6-(phenylazo)naphthalene-2,7-disulphonate, and disodium 4-amino-3,6-bis[[4-[(2,4-diaminophenyl)azo]phenyl]azo]-5-hydroxynaphthalene-2,7-disulphonate 2,7-naphthalenedisulfonic acid.

The capping layer may further include a photosensitive material.

The photosensitive material may include at least one of ammonium dichromate, a diazo resin, a styrylpyridium group, and a stilbazolium group.

The capping layer may further include an adhesion catalyst.

The adhesion catalyst may include a compound represented by Chemical Formula 2.

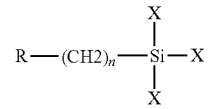

Chemical Formula 2

The capping layer may be disposed along the liquid crystal injection portion, and is opened at portions corresponding to the microcavities.

The capping layer may include a first light blocking member disposed along the liquid crystal injection portion and a second light blocking member disposed to cross the first light blocking member, and the first light blocking member and the second light blocking member may include the same material.

The capping layer may be formed to have a matrix shape in a display area.

The liquid crystal display may further include a light blocking member disposed along a data line of the thin film transistor, and the light blocking member may be disposed at a layer that is different from the capping layer disposed along the liquid crystal injection portion.

The liquid crystal material of the liquid crystal layer and the capping layer may contact each other.

An exemplary embodiment provides a manufacturing method of a liquid crystal display, the method including: forming a thin film transistor on a substrate including a display area and a peripheral area; forming a pixel electrode on the thin film transistor in the display area; forming a sacrificial layer on the pixel electrode; forming a roof layer on the sacrificial layer; forming a plurality of microcavities by removing the sacrificial layer, a liquid crystal injection portion being formed in each of the microcavities, wherein a pixel area corresponds to the microcavities; injecting a liquid crystal material into the microcavities through the liquid crystal injection portions; coating a capping material on the display area and the peripheral area to cover the roof layer and the liquid crystal injection portions; and forming a capping layer by patterning the capping material and removing the capping material coated on the pixel area.

The capping material may include a water-soluble polymer material, a photosensitive material, and a light-blocking material.

The forming of the capping layer may include removing the capping material coated on the peripheral area and the pixel area by disposing a mask on the substrate and by using an exposure and developing process.

The capping layer may be formed in a matrix pattern in the display area.

The water-soluble polymer material may include at least one of polyvinyl alcohol (PVA), methoxypolyethylene glycol, polyethylene glycol, polyethylene glycol diacrylate, polyethylene glycol dimethacrylate, and polyvinylpyrrolidone.

The light-blocking material may include a water-soluble black dye or a black pigment.

The water-soluble black dye may include at least one of 2-naphthalenesulfonic acid, trisodium 6-[(7-amino-1-hydroxy-3-sulphonato-2-naphthyl)azo]-3-4-4-amino-6 or 7-sulphonatonaphthyl-azo-phenyl-azo-4-hydroxynaphthalene-2-sulphonate, trisodium 4-amino-3-[[4-[[4-[(2-amino-4-hydroxyphenyl)azo]phenyl]amino]-3-sulphonatophenyl]azo]-5-hydroxy-6-(phenylazo)naphthalene-2,7-disulphonate, and disodium 4-amino-3,6-bis[[4-[(2,4-diaminophenyl)azo]phenyl]azo]-5-hydroxynaphthalene-2,7-disulphonate 2,7-naphthalenedisulfonic acid.

The photosensitive material may include at least one of ammonium dichromate, a diazo resin, a styrylpyridium group, and a stilbazolium group.

The microcavities may include a plurality of regions, the liquid crystal injection portions are formed between the regions, and the capping layer may be formed along the liquid crystal injection portions.

The liquid crystal injection portions may be formed to extend in a direction that is parallel with a gate line connected to the thin film transistor.

According to the exemplary embodiments, it is possible to prevent contamination of liquid crystals by forming the capping layer including the water-soluble polymer material, it is possible to expose a pad unit of the peripheral portion through the photolithography process by forming the capping layer facilitating the photolithography process, and additional forming of a light-blocking member can be omitted by forming the capping layer including the light-blocking material, thereby reducing the processes.

DETAILED DESCRIPTION OF THE EMBODIMENTS

Figure 1:
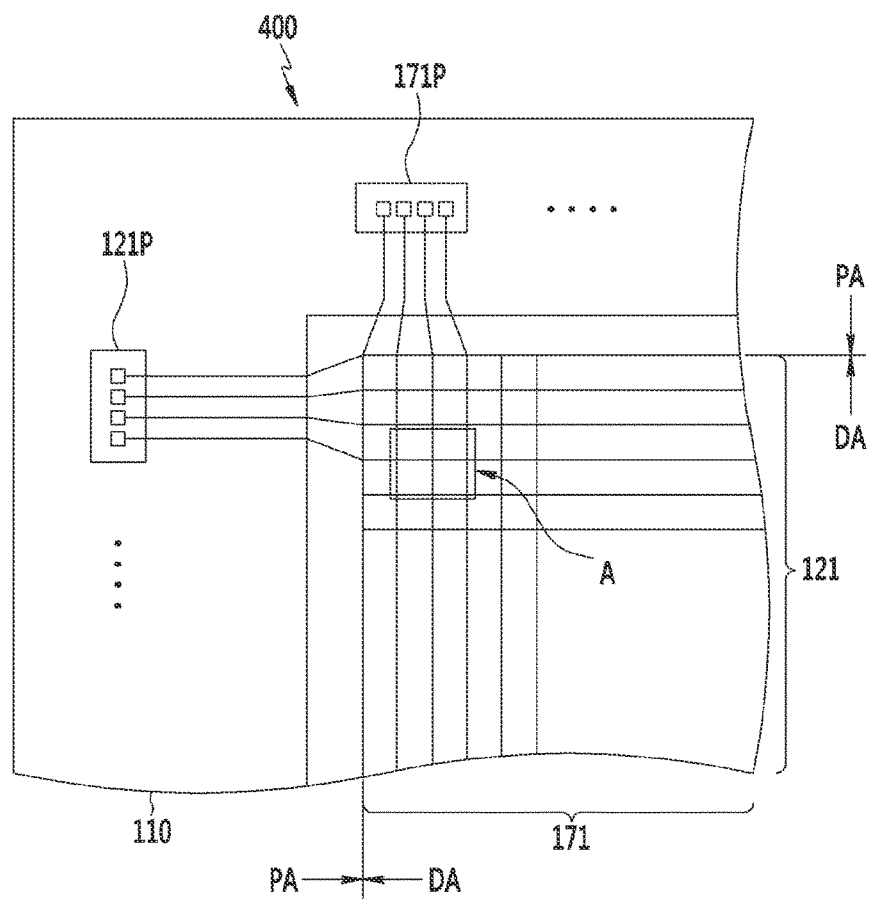
FIG. 1 is a top plan view partially illustrating a peripheral area and a display area in a liquid crystal display according to an exemplary embodiment.

Hereinafter, exemplary embodiments will be described in detail with reference to the accompanying drawings. As those skilled in the art would realize, the described embodiments may be modified in various different ways, all without departing from the spirit or scope of the inventive concept. On the contrary, exemplary embodiments introduced herein are provided to make disclosed contents thorough and complete and to sufficiently transfer the spirit of the inventive concept to those skilled in the art.

In the drawings, the thickness of layers, films, panels, regions, etc., are exaggerated for clarity. It will be understood that when a layer is referred to as being "on" another layer or substrate, it can be directly on the other layer or substrate, or another layer or substrate intervening them may also be present. Like reference numerals designate like elements throughout the specification.

FIG. 1 is a top plan view partially illustrating a peripheral area and a display area in a liquid crystal display according to an exemplary embodiment.

Referring to FIG. 1, the liquid crystal display according to the present exemplary embodiment may include a liquid crystal panel assembly 400, a gate driver (not shown) and a data driver (not shown) connected thereto, a gray voltage generator (not shown) connected to the data driver, a light source unit (not shown) emitting light to the liquid crystal panel assembly 400, a light source driver (not shown) controlling the light source unit, and a signal controller (not shown) controlling them.

The gate driver or the data driver may be formed on the liquid crystal panel 30) assembly 400, and may be formed as a separate integrated circuit chip.

A substrate 110 of the liquid crystal panel assembly 400 includes a display area DA and a peripheral area PA positioned to surround the display area DA. The display region DA is a region where an actual image is outputted, and in the peripheral region PA, the aforementioned gate driver or data driver is formed, or a gate pad portion 121P, a data pad portion 171P including a gate pad, a data pad, or the like, which is a portion connected to an external circuit, is positioned. The gate pad is a wide portion positioned at an end of a gate line 121, and the data pad is a wide portion positioned at an end of a data line 171.

Hereinafter, constituent elements disposed in a display area DA of the liquid crystal display will be described in detail with reference to FIG. 2 to FIG. 4.

Figure 2:
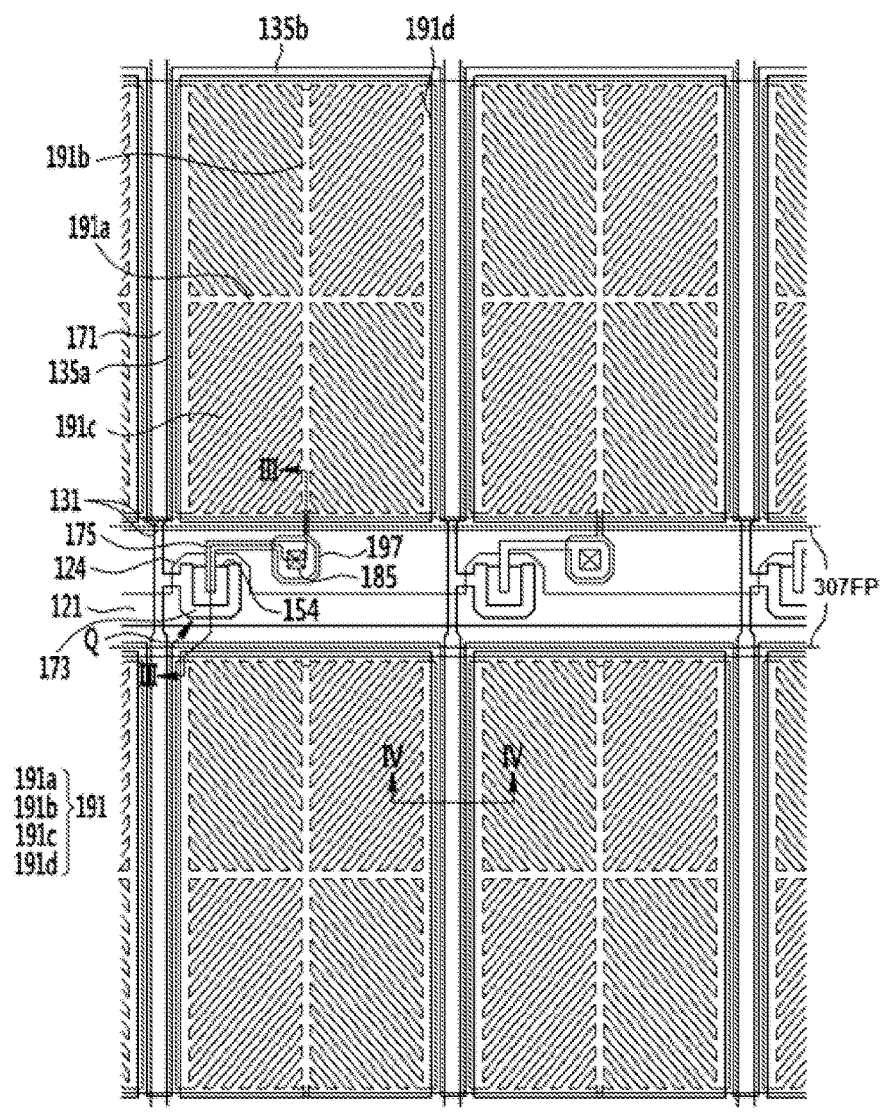
FIG. 2 is a top plan view showing a region A of FIG. 1 of the liquid crystal display according to an exemplary embodiment.

FIG. 2 is a top plan view showing a region A of FIG. 1 of the liquid crystal display according to an exemplary embodiment. FIG. 3 is a cross-sectional view taken along the line III-III of FIG. 2. FIG. 4 is a cross-sectional view taken along the line IV-IV of FIG. 2.

FIG. 2 shows a 2×2 pixel portion of a plurality of pixels, and these pixels may be repeatedly arranged up/down and right/left in the liquid crystal display according to an exemplary embodiment.

Figure 3:
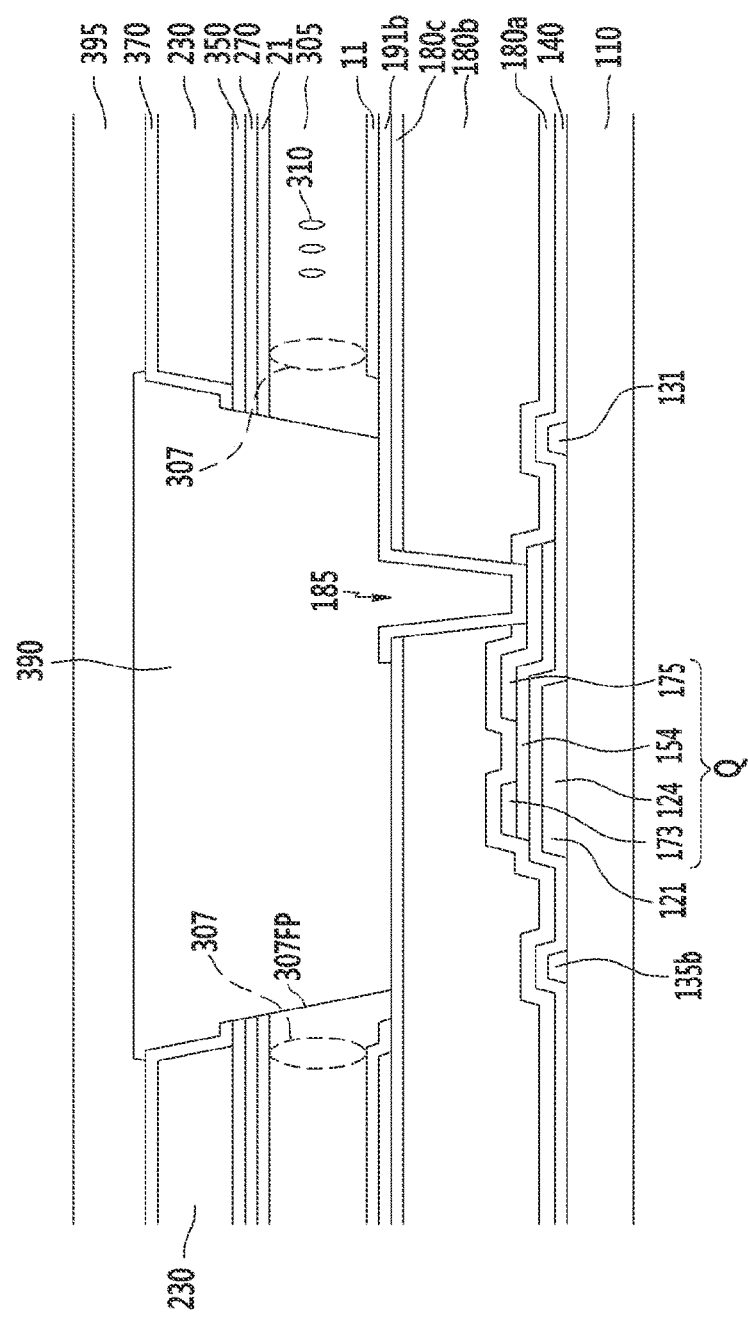
FIG. 3 is a cross-sectional view taken along the line III-III of FIG. 2.
Figure 4:
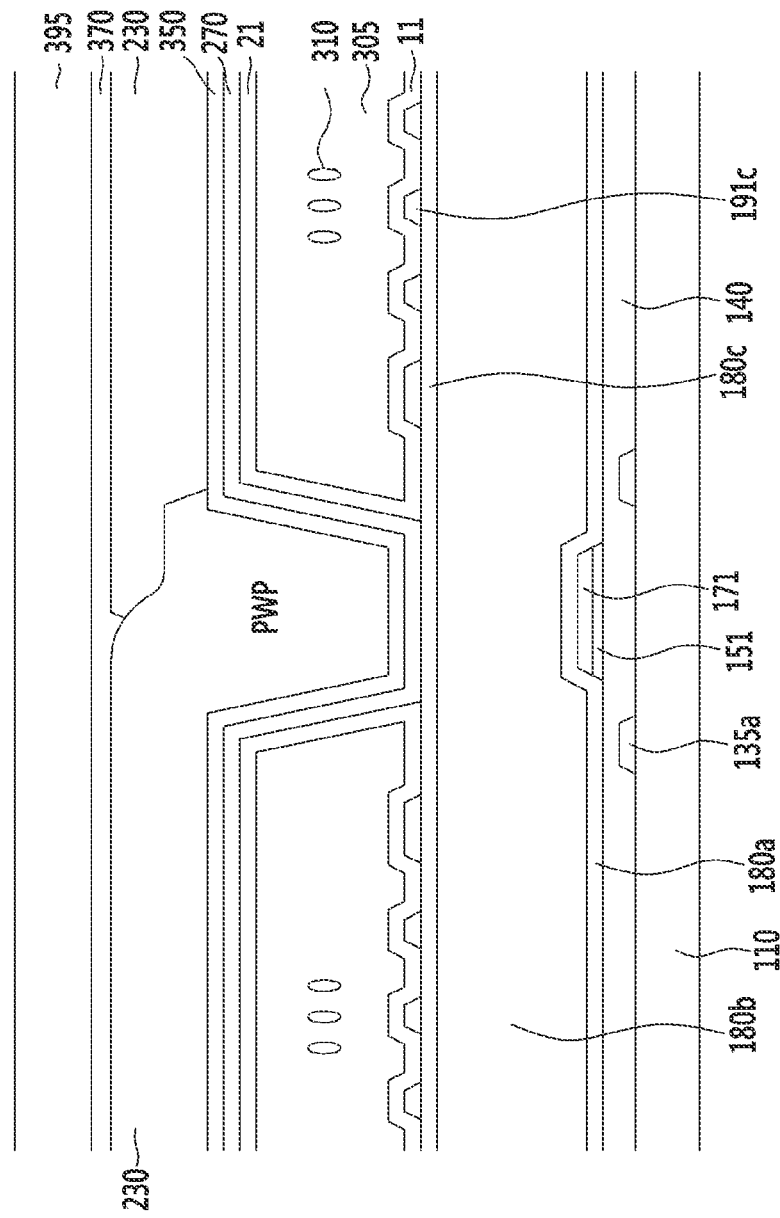
FIG. 4 is a cross-sectional view taken along the line IV-IV of FIG. 2.

Referring to FIG. 2 to FIG. 4, the gate line 121 and a storage electrode line 131 are formed on the substrate 110 made of transparent glass or plastic. The gate line 121 includes a gate electrode 124. The storage electrode line 131 is mainly extended in a horizontal direction, and transfers a predetermined voltage such as a common voltage Vcom. The storage electrode line 131 includes a pair of vertical storage electrode portions 135a substantially extended to be perpendicular to the gate line 121, and a horizontal storage electrode portion 135b connecting ends of the pair of vertical storage electrode portions 135a to each other. The vertical and horizontal storage electrode portions 135a and 135b have a structure surrounding a pixel electrode 191.

A gate insulating layer 140 is formed on the gate line 121 and the storage electrode line 131. A semiconductor layer 151 positioned under the data line 171 and a semiconductor layer 154 positioned under source/drain electrodes 173, 175 and corresponding to a channel region of a thin film transistor Q are formed on the gate insulating layer 140.

A plurality of ohmic contacts may be formed between the semiconductor layer 151 and the data line 171, and between the semiconductor layer 154 under the source/drain electrodes 173, 175 and corresponding to the channel region and the source/drain electrodes 173, 175, and are omitted in the drawings.

Data conductors 171, 173, and 175 including the source electrode 173, the data line 171 connected to the source electrode 173, and the drain electrode 175 are formed on the semiconductor layers 151 and 154 and the gate insulating layer 140.

The gate electrode 124, the source electrode 173, and the drain electrode 175 form a thin film transistor Q along with the semiconductor layer 154, and the channel of the thin film transistor Q is formed in the exposed portion of the semiconductor layer 154 between the source electrode 173 and the drain electrode 175.

A first interlayer insulating layer 180a is formed on the data conductors 171, 173, and 175 and a portion of the semiconductor layer 154 that is exposed since it is not covered by the source electrode 173 and the drain electrode 175. The first interlayer insulating layer 180a may include an inorganic insulator such as a silicon nitride (SiNx) and a silicon oxide (SiOx).

A second interlayer insulating layer 180b and a third interlayer insulating layer 180c may be positioned on the first interlayer insulating layer 180a. The second interlayer insulating layer 180b may be formed of the organic material, and the third interlayer insulating layer 180c may include the inorganic insulator such as the silicon nitride (SiNx) and the silicon oxide (SiOx). The second interlayer insulating layer 180b is formed of the organic material thereby reducing or removing a step. Differently from the present exemplary embodiment, one or two of the first interlayer insulating layer 180a, the second interlayer insulating layer 180b, and the third interlayer insulating layer 180c may be omitted.

A contact hole 185 may be formed to extend through the first interlayer insulating layer 180a, the second interlayer insulating layer 180b, and the third interlayer insulating layer 180c. A pixel electrode 191 positioned on the third interlayer insulating layer 180c may be electrically and physically connected to the drain electrode 175 through the contact hole 185. Hereafter, the pixel electrode 191 will be described in detail.

The pixel electrode 191 may be made of a transparent conductive material such as ITO or IZO.

An overall shape of the pixel electrode 191 is a quadrangle, and the pixel electrode 191 includes cross stems configured by a horizontal stem 191a and a vertical stem 191b crossing the horizontal stem 191a. Further, the pixel electrode 191 is divided into four sub-regions by the horizontal stem 191a and the vertical stem 191b, and each sub-region includes a plurality of minute branches 191c. In the present exemplary embodiment, the pixel electrode 191 may further include an outer stem 191d connecting the minute branches 191c at right and left edges of the pixel electrode 191. In the present exemplary embodiment, the outer stem 191d is positioned at the right and left edges of the pixel electrode 191, however it may be positioned to extend to an upper portion or a lower portion of the pixel electrode 191.

The minute branches 191c of the pixel electrode 191 form an angle of approximately 40° to 45° with the gate line 121 or the horizontal stem 191a. Further, the minute branches 191c of two adjacent sub-regions may be perpendicular to each other. In addition, a width of each minute branch 191c may be gradually increased, or a distance between the minute branches 191c may be varied.

The pixel electrode 191 includes an extension 197 which is connected at a lower end of the vertical stem 191b, has a larger area than the vertical stem 191b, and is electrically and physically connected to the drain electrode 175 through the contact hole 185 at the extension 197, thereby receiving the data voltage from the drain electrode 175.

The thin film transistor Q and the pixel electrode 191 described above are just examples, and a structure of the thin film transistor and a design of the pixel electrode may be modified in order to improve side visibility.

A lower alignment layer 11 is formed on the pixel electrode 191, and may be a vertical alignment layer. The lower alignment layer 11, as a liquid crystal alignment layer made of a material such as polyamic acid, a polysiloxane, a polyimide, or the like, may include at least one of generally used materials. Further, the lower alignment layer 11 may be a photoalignment layer.

An upper alignment layer 21 is disposed at a portion facing the lower alignment layer 11, and a microcavity 305 is formed between the lower alignment layer 11 and the upper alignment layer 21. A liquid crystal material including liquid crystal molecules 310, sometimes called liquid crystals, is injected into the microcavity 305, and the microcavity 305 has an entrance region 307. The microcavities 305 may be formed along a column direction of the pixel electrode 191, that is, in the vertical direction. In the present exemplary embodiment, the alignment material forming the alignment layers 11 and 21 and the liquid crystal material including the liquid crystal molecules 310 may be injected into the microcavity 305 by using capillary force. In the present exemplary embodiment, the lower alignment layer 11 and the upper alignment layer 21 are merely distinguished according to position, and may be connected to each other as shown as in FIG. 4. The lower alignment layer 11 and the upper alignment layer 21 may be simultaneously formed.

The microcavity 305 is divided in the vertical direction by a plurality of liquid crystal injection portions 307FP positioned at a portion overlapping the gate line 121, thereby forming the plurality of microcavities 305, and the plurality of microcavities 305 may be formed along a column direction of the pixel electrode 191, that is, in the vertical direction. Further, the microcavity 305 is divided in the horizontal direction by a partition PWP that will be described later, thereby forming the plurality of microcavities 305, and the microcavities 305 may be formed along the row direction of the pixel electrode 191, that is, the horizontal direction in which the gate line 121 extends. The formed microcavities 305 may respectively correspond to one or more pixel areas, and the pixel areas may correspond to a region displaying the image.

A common electrode 270 and a lower insulating layer 350 are positioned on the upper alignment layer 21. The common electrode 270 receives the common voltage, and generates an electric field together with the pixel electrode 191 to which the data voltage is applied to determine a direction in which the liquid crystal molecules 310 positioned at the microcavity 305 between the two electrodes 270, 191 are inclined. The common electrode 270 forms a capacitor with the pixel electrode 191 to maintain the received voltage even after the thin film transistor is turned off.

The lower insulating layer 350 may be formed of a silicon nitride (SiNx) or a silicon oxide (SiOx).

In the present exemplary embodiment, it is described that the common electrode 270 is formed on the microcavity 305, but in another exemplary embodiment, the common electrode 270 is formed under the microcavity 305, so that liquid crystal driving according to a coplanar electrode (CE) mode is possible.

In the present exemplary embodiment, a color filter 230, also called a roof layer 230, is disposed on the lower insulating layer 350. In the present exemplary embodiment, the roof layer 230 may be formed of a color filter. As shown in FIG. 4, among the color filters neighboring each other, the color filter 230 of one color forms the partition PWP. The partition PWP is disposed between the microcavities 305 neighboring in the horizontal direction. The partition PWP is a portion filling the separation space of the microcavities 305 neighboring in the horizontal direction. As shown in FIG. 4, the partition PWP completely fills the separation space of the microcavity 305, however it is not limited thereto, and it may partially fill the separation space. The partition PWP may be formed along the direction that the data line 171 extends.

The color filters 230 neighboring each other on the partition PWP may overlap. The boundary surface where the neighboring color filters 230 meet each other may be positioned at the portion corresponding to the partition PWP.

Hereinafter, the roof layer 230 formed of a color filter according to an exemplary embodiment will be described with reference to FIGS. 5 and 6.

Figure 5:
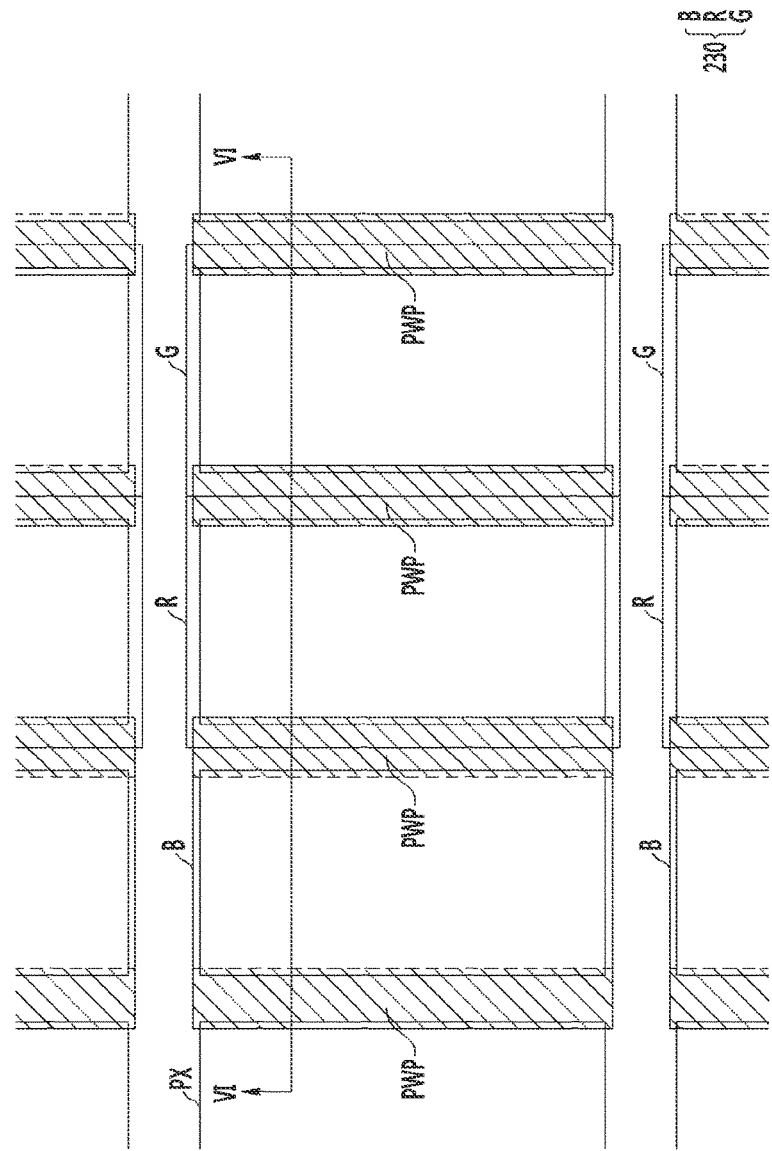
FIG. 5 is a top plan view of a color filter and a partition in a liquid crystal display according to an exemplary embodiment.

FIG. 5 is a top plan view of a color filter 230 and the partition PWP in a liquid crystal display according to an exemplary embodiment. FIG. 6 is a cross-sectional view taken along the line VI-VI of FIG. 5.

Figure 6:
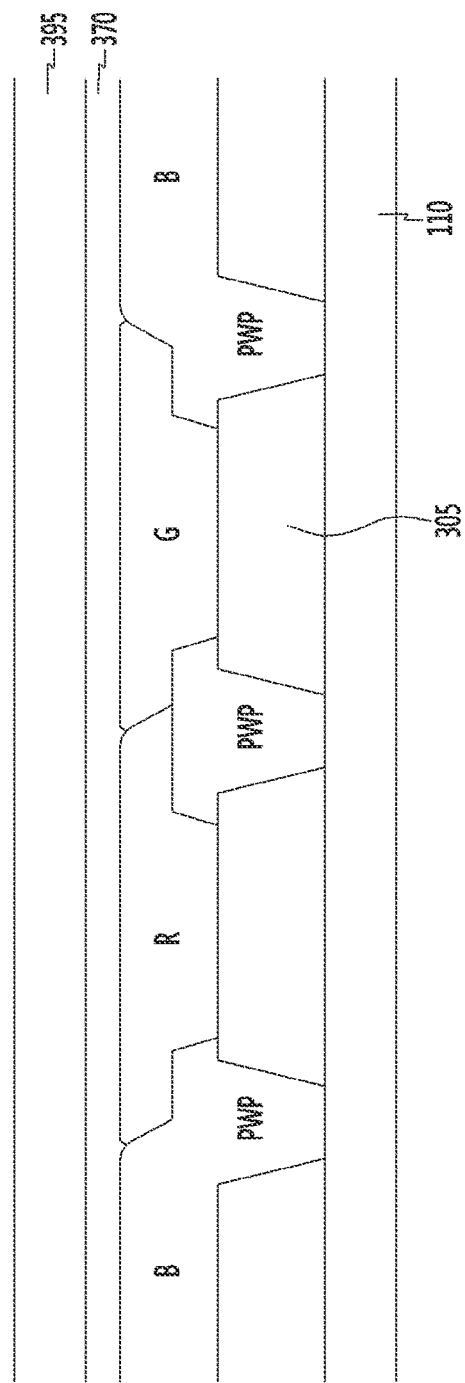
FIG. 6 is a cross-sectional view taken along the line VI-VI of FIG. 5.

FIGS. 5 and 6 are views to schematically explain the color filter 230 and the partition PWP in the liquid crystal display according to an exemplary embodiment, and the constituent elements between the substrate 110 and the microcavity 305 may be applied with the description in FIG. 2 to FIG. 4 as it is.

Referring to FIGS. 5 and 6, the color filter 230 according to the present exemplary embodiment includes a first color filter, a second color filter, and a third color filter, and the first color filter may include a blue color filter B, the second color filter may include a red color filter R, and the third color filter may include a green color filter G.

According to the present exemplary embodiment, the partition PWP is formed by any one among the first color filter, the second color filter, and the third color filter. In an exemplary embodiment, the first color filter corresponding to the blue color filter B forms the partition PWP. The blue color filter B may include the partition PWP extended from the portion corresponding to the pixel area PX and the partition PW positioned between the red color filter R and the green color filter G. In this case, the red color filter R and the green color filter G covering edges opposite to each other in the partition PWP are simultaneously adjacent to each other, and may overlap on the partition PWP.

Instead of the blue color filter B, it is possible to form the partition PWP made of the red color filter R or the green color filter G. However, the blue color filter B has a larger blocking effect compared with the red color filter R or the green color filter G, and thus there is a merit of reducing reflection of the light if the partition PWP is formed of the blue color filter B. In addition, the blue color filter B has excellent fluidity of a photoresist of the color filter as well as the light blocking effect, thereby obtaining a good taper angle. Accordingly, compared with a case that an end shape of the color filter forming the partition PWP is undercut is vertical, the end of the color filter is slanted with an angle of more than about 45 degrees, so the color filter coated on the partition PWP while covering the side wall of the partition PWP may be well formed.

As shown in FIG. 5, the color filter 230 may be formed to have an island shape to correspond to the pixel area PX.

The inventive concept is not limited to the aforementioned exemplary embodiment. For example, color filters 230 which are adjacent to each partition PWP may form the partitions PWP.

Again referring to FIGS. 3 and 4, an upper insulating layer 370 is disposed on the roof layer (color filter) 230. The upper insulating layer 370 may be formed of silicon nitride (SiNx) or silicon oxide (SiOx). As shown in FIG. 2, the side surface of the color filter 230 may be covered by the upper insulating layer 370.

Figure 7:
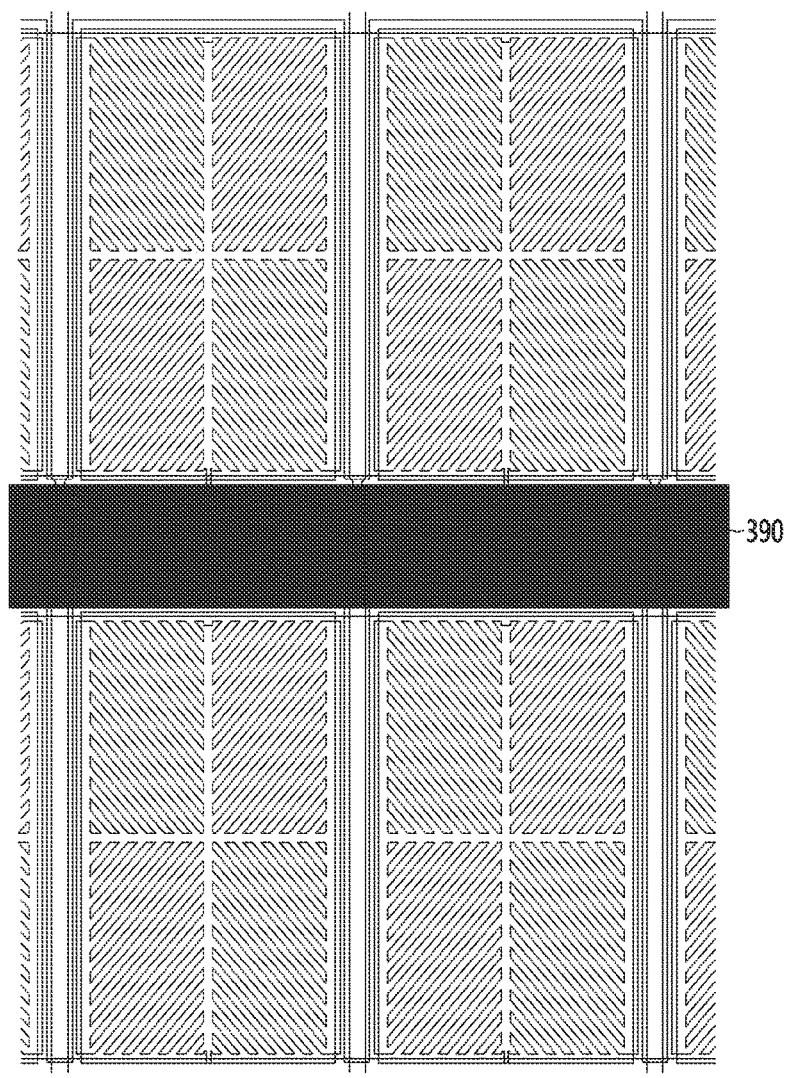
FIG. 7 is a top plan view illustrating how a capping layer is disposed in a liquid crystal display according to an exemplary embodiment.

FIG. 7 is a top plan view illustrating how a capping layer 390 is disposed in a liquid crystal display according to an exemplary embodiment.

Referring to FIGS. 3 and 7, the capping layer 390 is disposed at the liquid crystal injection portion 307FP in the display area, and covers the entrance region 307 of the microcavity 305 exposed by the liquid crystal injection portion 307FP. The capping layer 390 may contact a liquid crystal material positioned at the microcavity 305. In detail, the capping layer 390 may be disposed along the liquid crystal injection portion 307FP, and the capping layer 390 may be not formed in a portion corresponding to the microcavity 305, which substantially corresponds to the pixel area.

In the present exemplary embodiment, the capping layer 390 includes a water-soluble polymer material and a light-blocking material. In the present exemplary embodiment, the water-soluble polymer material may be polyvinyl alcohol represented by Chemical Formula 1. Further, the water-soluble polymer material according to the present exemplary embodiment may include at least one of methoxypolyethylene glycol, polyethylene glycol, polyethylene glycol diacrylate, polyethylene glycol dimethacrylate, and polyvinylpyrrolidone. In Chemical Formula 1, n indicates the number of repeating units, and may be a natural number.

Chemical Formula 1

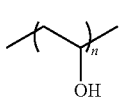

In the present exemplary embodiment, the light-blocking material may include a water-soluble black dye or a black pigment. The water-soluble black dye can be dissolved by a capping material that is employed to form the capping layer 390, and the black pigment may be dispersed in the capping material.

The water-soluble black dye of the present exemplary embodiment may include at least one of 2-naphthalenesulfonic acid, trisodium 6-[(7-amino-1-hydroxy-3-sulphonato-2-naphthyl)azo]-3-4-4-amino-6 or 7-sulphonatonaphthyl-azo-phenyl-azo-4-hydroxynaphthalene-2-sulphonate, trisodium 4-amino-3-[[4-[[4-[(2-amino-4-hydroxyphenyl)azo]phenyl]amino]-3-sulphonatophenyl]azo]-5-hydroxy-6-(phenylazo)naphthalene-2,7-disulphonate, and disodium 4-amino-3,6-bis[[4-[(2,4-diaminophenyl)azo]phenyl]azo]-5-hydroxynaphthalene-2,7-disulphonate 2,7-naphthalene-disulfonic acid.

In the present exemplary embodiment, since the capping layer 390 includes the water-soluble polymer material, even though the capping layer 390 comes into contact with the liquid crystal material that is hydrophobic, the liquid crystal material is not contaminated. Further, the capping layer 390 including the light-blocking material can serve as a black matrix for blocking light leakage. Accordingly, an additional process for forming the black matrix serving as a light blocking member may be omitted.

In addition, the capping layer 390 may include a photosensitive material and thus can be subjected to a photolithography process. Herein, the photosensitive material may include at least one of ammonium dichromate, a diazo resin, a styrylpyridium group, and a stilbazolium group.

The capping layer 390 may further include an adhesion catalyst. Herein, the adhesion catalyst may be a compound represented by Chemical Formula 2.

Chemical Formula 2

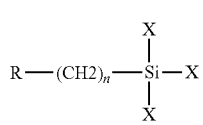

In Chemical Formula 2, R may include a methyl group, a vinyl group, an acrylate, a methacrylate, and an epoxy group, X may indicate —OCH$_3$, and n may be in a range of 1 to 30. In detail, the adhesion catalyst may be (3-aminopropyl)-triethoxysilane or 3-(trimethoxysilyl)-propyl methacrylate.

An overcoat 395 formed of an inorganic film or an organic film may be disposed on the capping layer 390. The overcoat 395 serves to protect crystal molecules 310 injected into the microcavity 305 from external impact and planarize the film. In addition, the overcoat 395 may also serve to block external moisture and oxygen.

In the present exemplary embodiment, as shown in FIG. 4, the partitions PWP are formed by the color filters 230 having a single color disposed between the microcavities 305 that are adjacent to each other in a horizontal direction. The partitions PWP can partition or define the microcavities 305 by forming partition walls. In the present exemplary embodiment, a partition structure such as the partitions PWP is disposed between the microcavities 305. Accordingly, even if the substrate 110 is bent, less stress may be generated and a degree at which the cell gap is deformed may be reduced.

In the present exemplary embodiment, it has been described that the roof layer is formed of the color filter. However, the roof layer may be formed of an organic film or an inorganic film, and the color filter may be formed at a lower portion of the pixel electrode 191.

Figure 8:
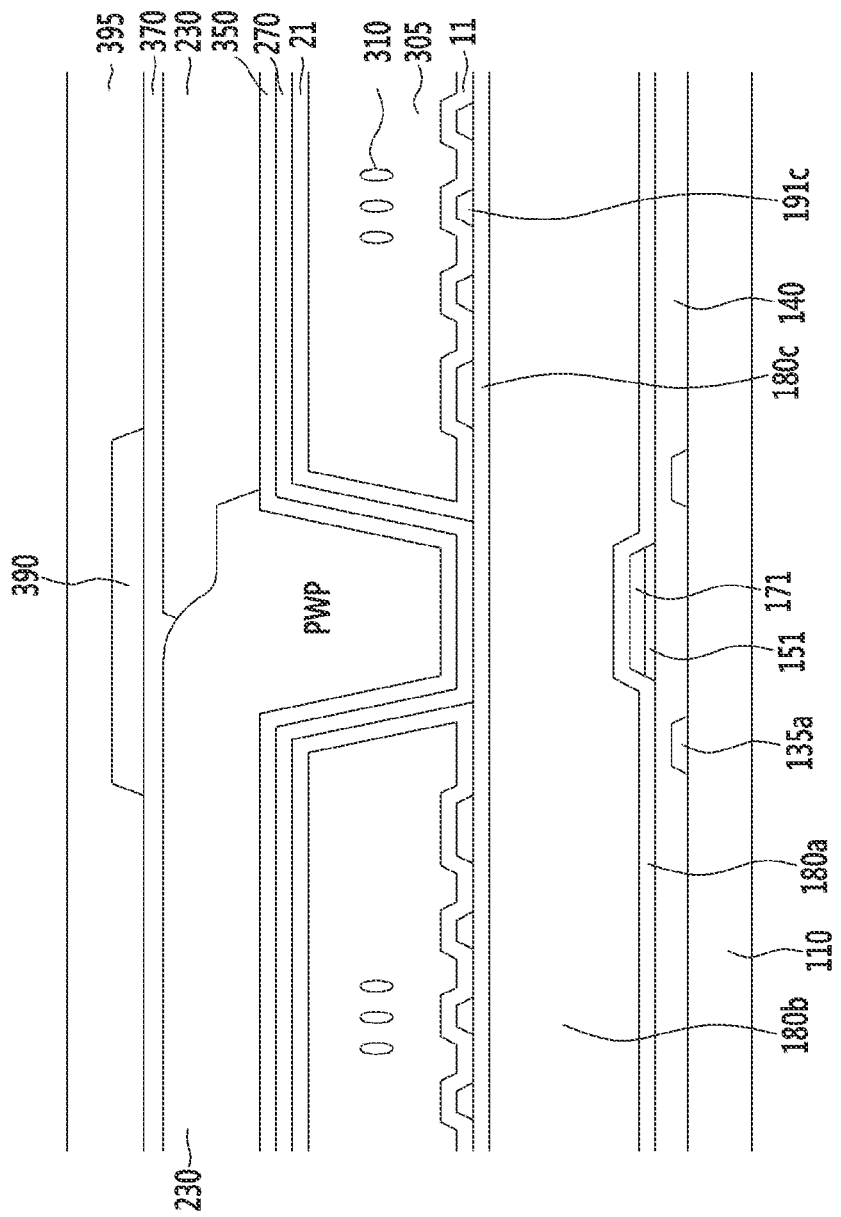
FIG. 8 is a cross-sectional view illustrating a liquid crystal display according to a modification of the exemplary embodiment of FIG. 4.
Figure 9:
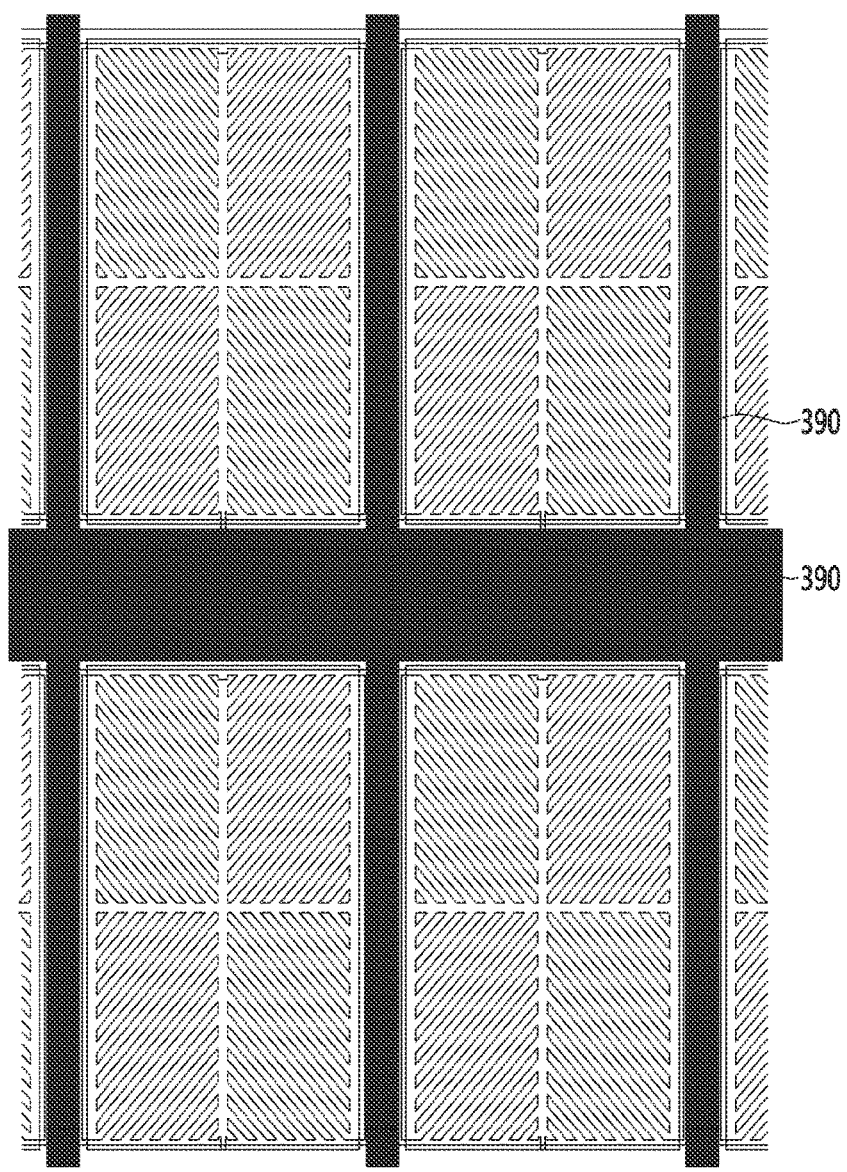
FIG. 9 is a top plan view illustrating how a capping layer is disposed in the liquid crystal display according to the exemplary embodiment of FIG. 8.

FIG. 8 is a cross-sectional view illustrating a liquid crystal display according to a modification of the exemplary embodiment of FIG. 4. FIG. 9 is a top plan view illustrating how a capping layer 390 is disposed in the liquid crystal display according to the exemplary embodiment of FIG. 8.

Referring to FIGS. 8 and 9, the present exemplary embodiment is the same as most of the exemplary embodiment described in FIG. 4. However, the capping layer 390 is formed along the liquid crystal injection portion 307FP, and the capping layer 390 is disposed on the upper insulating layer 370 in a direction in which the data line 171 extends. The capping layer 390 described herein includes a first light blocking member disposed along the liquid crystal injection portion 307FP and a second light blocking member disposed in a direction of the data line 171, and the first light blocking member and the second light blocking member may be formed of the same material by using the same process. As shown in FIG. 9, the first light blocking member and the second light blocking member may be formed to have a matrix shape.

Figure 10:
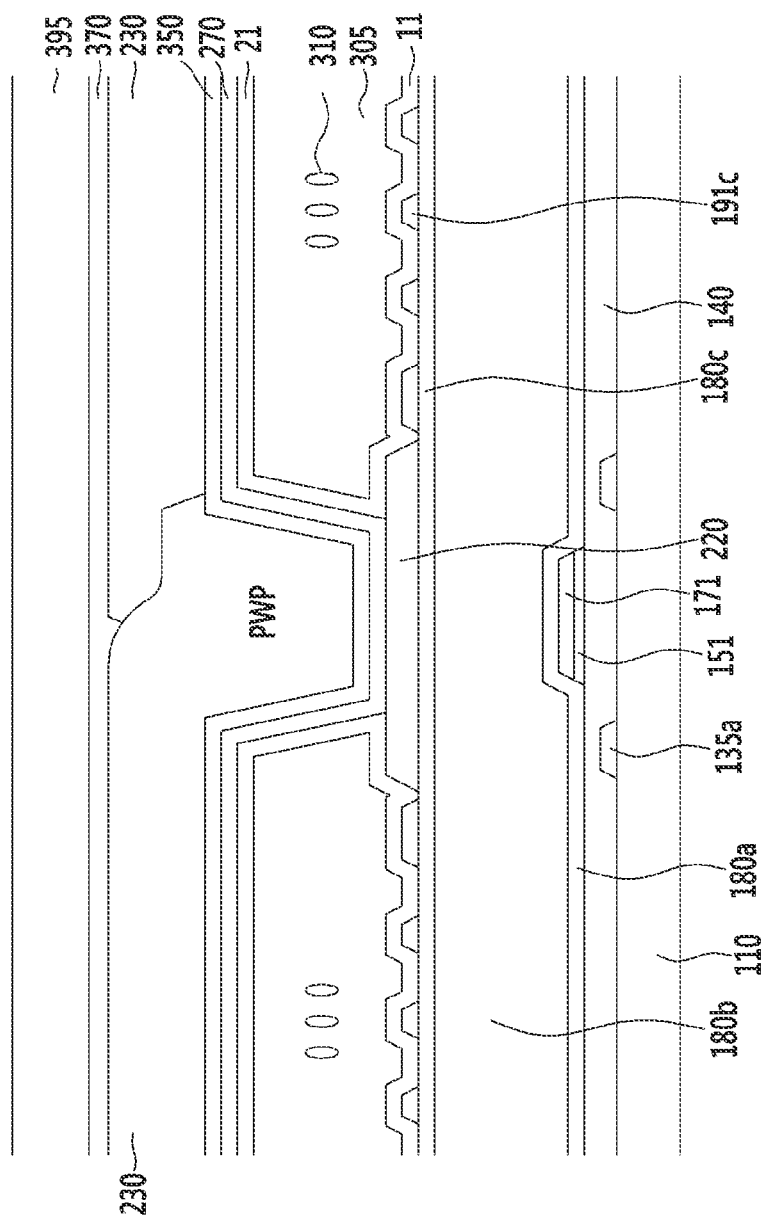
FIG. 10 is a cross-sectional view illustrating a liquid crystal display according to a modification of the exemplary embodiment of FIG. 4.

FIG. 10 is a cross-sectional view illustrating a liquid crystal display according to a modification of the exemplary embodiment of FIG. 4.

Referring to FIG. 10, the present exemplary embodiment is the same as most of the exemplary embodiment described in FIG. 4. However, a light blocking member 220 is formed along the direction in which the data line 171 extends. The light blocking member 220 is disposed on the third interlayer insulating layer 180c or the pixel electrode 191. The light blocking member 220 described herein may be formed to have a matrix shape similar to the capping layer 390 in a plan view. The light blocking member 220 may be made of a material that is different from that of the capping layer 390. The light blocking member 220 may include an organic material, unlike the capping layer.

Figure 11:
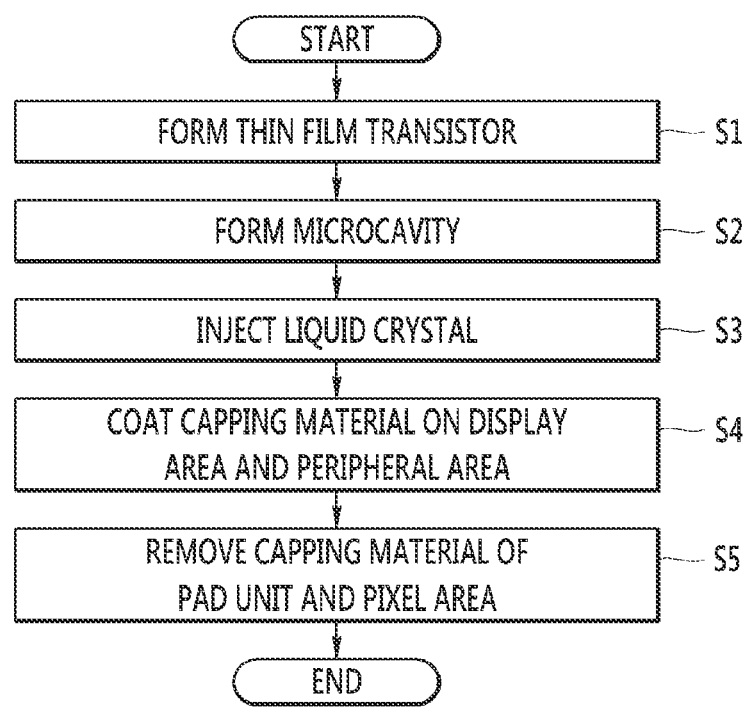
FIG. 11 is a flowchart illustrating a manufacturing method of a liquid crystal display according to an exemplary embodiment.
Figure 12:
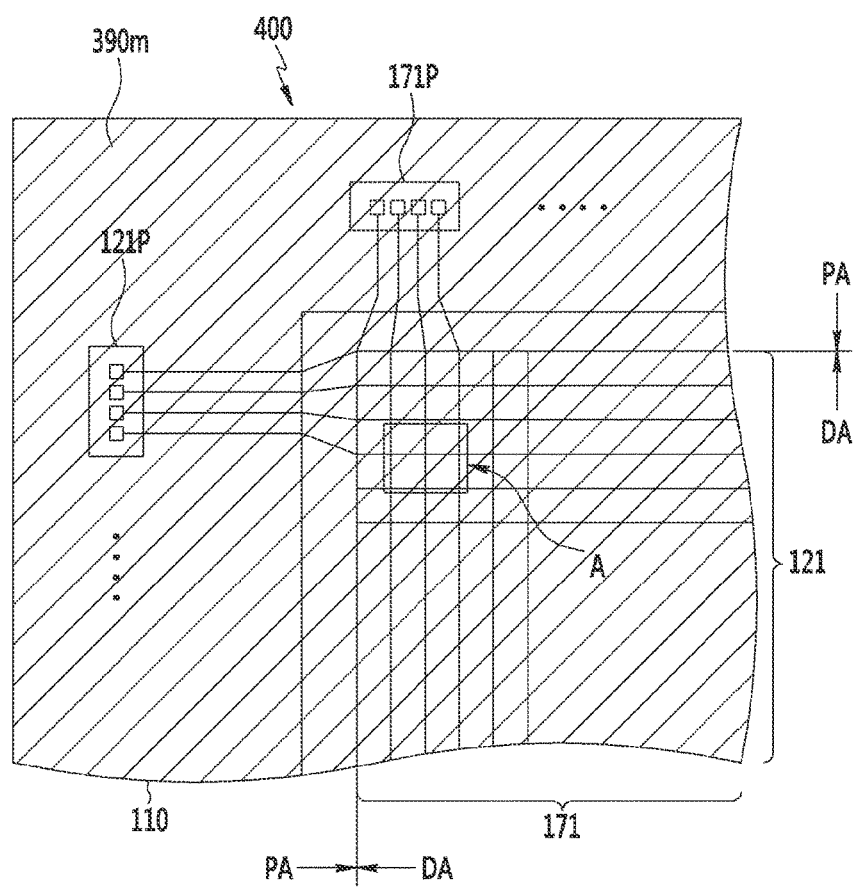
FIGS. 12, 13, and 14 are top plan views and cross-sectional views illustrating a manufacturing method of a liquid crystal display according to an exemplary embodiment.
Figure 13:
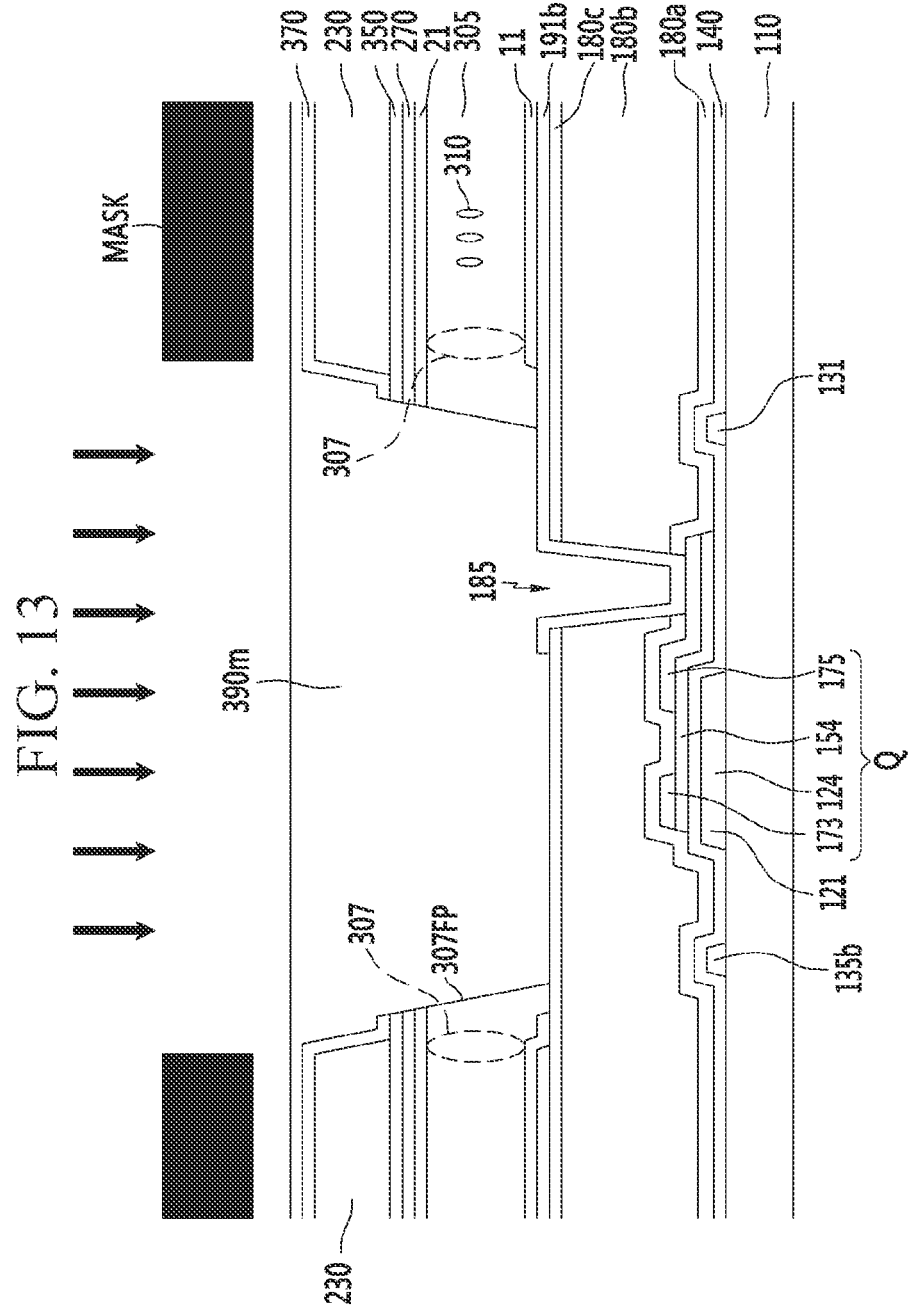
Figure 14:
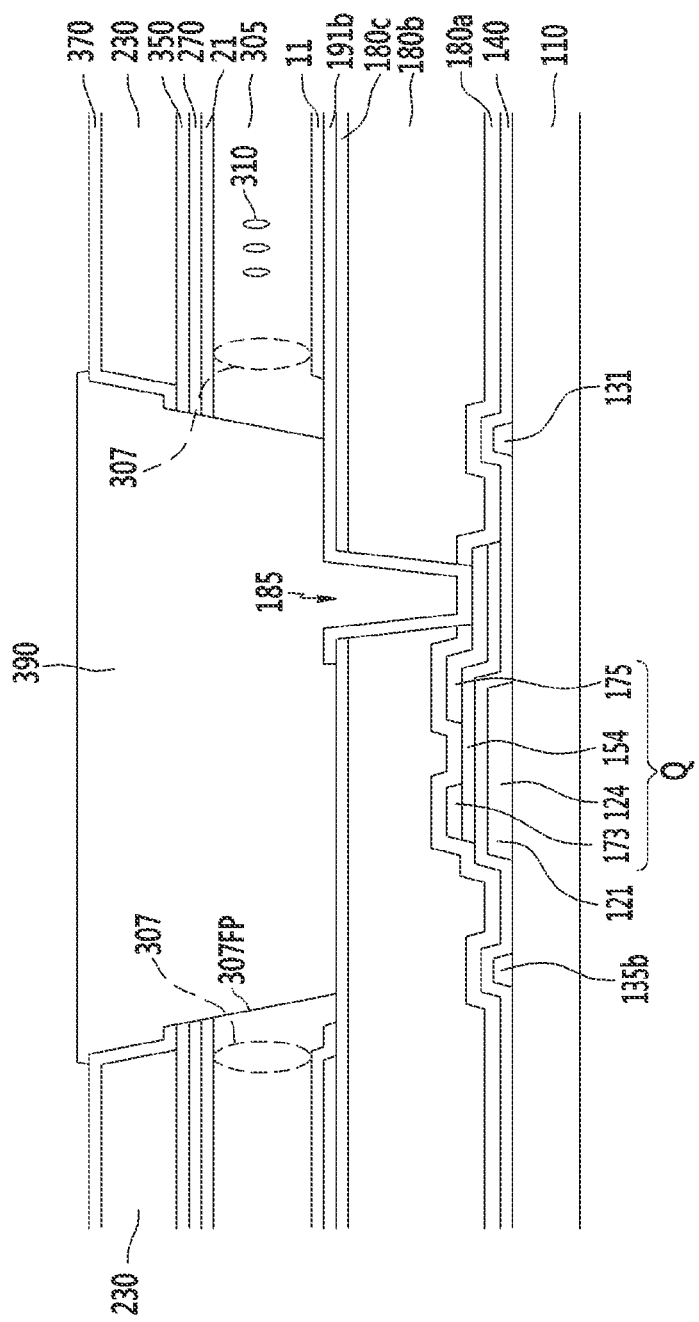

FIG. 11 is a flowchart illustrating a manufacturing method of a liquid crystal display according to an exemplary embodiment. FIG. 12 to FIG. 14 are top plan views and cross-sectional views illustrating a manufacturing method of a liquid crystal display according to an exemplary embodiment.

Referring to FIG. 11, the method of manufacturing the liquid crystal display according to the exemplary embodiment includes forming the thin film transistor Q on the substrate 110 (operation S1).

The thin film transistor Q may serve as a switching element in the present exemplary embodiment, and may control, input, and output a signal in order to display an image.

In the present exemplary embodiment, as illustrated in FIG. 2, the single thin film transistor Q is formed such that the signal is controlled, inputted, and outputted, but this thin film transistor structure can be modified.

Referring back to FIG. 2 to FIG. 4, the first interlayer insulating layer 180a, the second interlayer insulating layer 180b, and the third interlayer insulating layer 180c are formed on the thin film transistor Q, and the contact hole 185 is formed to extend through the first interlayer insulating layer 180a, the second interlayer insulating layer 180b, and the third interlayer insulating layer 180c. Next, the pixel electrode 191 is formed on the third interlayer insulating layer 180c, and the pixel electrode 191 is electrically and physically connected to the drain electrode 175 of the thin film transistor Q through the contact hole 185.

Next, a sacrificial layer is formed on the pixel electrode 191. In this case, an open portion (not shown) is formed along the direction parallel to the data line 171 in the sacrificial layer. In the open portion, the color filter 230 may be filled in a following process thereby forming the partition PWP. The sacrificial layer may be formed of a photoresist or the organic material. The pixel electrode 191 may be made of a transparent conductor such as ITO or IZO.

Thereafter, the method includes forming the microcavity 305 (operation S2).

The method of forming the microcavity 305 will be described with reference back to FIG. 2 to FIG. 4. The common electrode 270 and the lower insulating layer 350 are sequentially formed on the sacrificial layer. The common electrode 270 may be formed of a transparent conductor such as ITO or IZO, and the lower insulating layer 350 may be formed of silicon nitride (SiNx) or silicon oxide (SiOx). The roof layer 230 and the upper insulating layer 370 are sequentially formed on the lower insulating layer 350. The roof layer 230 according to the present exemplary embodiment may be formed of the color filter. The upper insulating layer 370 may be formed of silicon nitride (SiNx) or silicon oxide (SiOx). Herein, the roof layer 230 formed of the color filter may be removed at the region at which the liquid crystal injection portion 307FP is formed by the patterning process or the exposure/developing process.

The sacrificial layer is exposed by sequentially patterning the upper insulating layer 370, the lower insulating layer 350, and the common electrode 270 which are disposed to correspond to the liquid crystal injection portion 307FP. The sacrificial layer is removed through the liquid crystal injection portion 307FP by an oxygen (O2) ashing treatment or a wet etching method. In this case, the microcavity 305 having the entrance region 307 is formed. The microcavity 305 is an empty space formed when the sacrificial layer is removed.

The alignment layers 11 and 21 are formed on the pixel electrode 191 and the common electrode 270 by injecting an aligning material through the entrance region 307.

Next, the liquid crystal material including the liquid crystals 310 is injected through the entrance region 307 into the microcavity 305 by using an inkjet method or the like (operation S3).

Next, if the liquid crystal material is injected, the liquid crystal material may be exposed to the outside through the liquid crystal injection portion 307FP. Accordingly, the capping material is coated thereon to cover the liquid crystal injection portion 307FP.

In this case, referring to FIG. 12, a capping material 390m according to the present exemplary embodiment is coated on the peripheral area PA as well as the display area DA (operation S4).

Since the capping material 390m is coated on the peripheral area PA, a gate pad 121P and a data pad 171P are also covered.

Next, the capping material 390m is removed in a pad unit of the peripheral area PA and the pixel area (operation S5).

Referring to FIG. 13, the exposure is performed by covering the pixel area corresponding to the microcavities 305 with a mask MASK. In this case, although not illustrated, the mask MASK can cover the peripheral area PA to cover the pad unit including the gate pad 121P and the data pad 171P of FIG. 12 as well as the pixel area.

Referring to FIG. 14, the mask MASK is removed, and the capping layer 390 is formed along the liquid crystal injection portion 307FP by forming the capping material 390m positioned in the pixel area through the exposure. In this case, the capping material 390m covering the pad unit is also removed, and thus an outer lead bonding (OLB) process can be performed. As such, since the capping material 390m according to the present exemplary embodiment includes a photosensitive material, patterning can be performed through the photolithography process.

In the present exemplary embodiment, patterning is performed in a negative photoresist form in which a portion not receiving light is removed during exposure. However, unlike this, the capping material 390m may be formed of a material having a positive photoresist property, and in this case, patterning may be performed by using a mask that is a reverse image of the aforementioned mask MASK.

While the inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

<Description of Symbols>

| | | | |
|---|---|---|---|
| 230 | roof layer | | |
| 310 | liquid crystal molecules | | |
| 305 | microcavity | 307FP | liquid crystal injection portion |
| 350 | lower insulating layer | 370 | upper insulating layer |
| 390 | capping layer | | |

What is claimed is:

1. A liquid crystal display comprising:
   a substrate;
   a thin film transistor disposed on the substrate;
   a pixel electrode connected to the thin film transistor;
   a roof layer disposed to overlap the pixel electrode;
   a liquid crystal layer disposed between the pixel electrode and the roof layer and formed by a plurality of microcavities,
   a liquid crystal injection portion disposed in and between each of the plurality of microcavities, and a capping layer filling the liquid crystal injection portions and directly contacting with the liquid crystal material of the liquid crystal layer,
   wherein the capping layer comprises a water-soluble polymer material, and includes a light-blocking material and a photosensitive material dispersed in the entire capping layer comprising the water-soluble polymer material.

2. The liquid crystal display of claim 1, wherein the water-soluble polymer material includes at least one of polyvinyl alcohol (PVA), methoxypolyethylene glycol, polyethylene glycol, polyethylene glycol diacrylate, polyethylene glycol dimethacrylate, and polyvinylpyrrolidone.

3. The liquid crystal display of claim 2, wherein the light-blocking material includes a water-soluble black dye or a black pigment.

4. The liquid crystal display of claim 3, wherein the water-soluble black dye includes at least one of 2-naphthalenesulfonic acid, trisodium 6-[(7-amino-1-hydroxy-3-sulphonato-2-naphthyl)azo]-3-4-4-amino-6or 7-sulphonatonaphthyl-azo-phenyl-azo-4-hydroxynaphthalene-2-sulphonate, trisodium 4-amino-3-[[4- [[4-[(2-amino-4-hydroxyphenyl)azo]phenyl]amino]-3-sulphonatophenyl]azo]-5-hydroxy-6-(phenylazo)naphthalene-2,7-disulphonate, and disodium 4-amino-3,6-bis[[4-[(2,4-diaminophenyl)azo]phenyl]azo]-5-hydroxynaphthalene-2, 7-disulphonate 2,7-naphthalenedisulfonic acid.

5. The liquid crystal display of claim 1, wherein the photosensitive material includes at least one of ammonium dichromate, a diazo resin, a styrylpyridium group, and a stilbazolium group.

6. The liquid crystal display of claim 1, wherein the capping layer further includes an adhesion catalyst.

7. The liquid crystal display of claim 6, wherein the adhesion catalyst includes a compound represented by Chemical Formula 2:

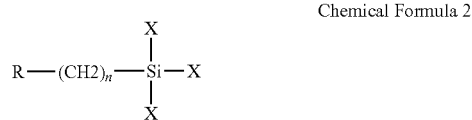

Chemical Formula 2 wherein, in Chemical Formula 2, R includes a methyl group, a vinyl group, an acrylate, a methacrylate, and an epoxy group, X indicates —OCH$_3$, and n is in a range of 1 to 30.

8. The liquid crystal display of claim 1, wherein the capping layer is opened at portions corresponding to the microcavities.

9. The liquid crystal display of claim 8, wherein the capping layer includes a first light blocking member disposed along each liquid crystal injection portion and a second light blocking member disposed to cross the first light blocking member, and
the first light blocking member and the second light blocking member include the same material.

10. The liquid crystal display of claim 9, wherein the capping layer is formed to have a matrix shape in a display area.

11. The liquid crystal display of claim 8, further comprising:
a light blocking member disposed along a data line of the thin film transistor, and the light blocking member is disposed at a layer that is different from the capping layer disposed along each liquid crystal injection portion.

12. A manufacturing method of a liquid crystal display, the method comprising:
forming a thin film transistor on a substrate including a display area and a peripheral area;
forming a pixel electrode on the thin film transistor in the display area;
forming a sacrificial layer on the pixel electrode;
forming a roof layer on the sacrificial layer;
forming a plurality of microcavities by removing the sacrificial layer, a liquid crystal injection portion being formed in and between each of the microcavities, wherein a pixel area corresponds to the microcavities;
injecting a liquid crystal material into the microcavities through the liquid crystal injection portions;
coating a capping material on the display area and the peripheral area to cover the roof layer and the liquid crystal injection portions;
forming a capping layer by removing the capping material from the peripheral area and removing the capping material coated on the pixel area;
wherein the capping layer fills the liquid crystal injection portions and directly contacts with the liquid crystal material in the microcavities;
wherein the capping layer comprises a water-soluble polymer material, and includes a light-blocking material and a photosensitive material dispersed in the entire capping layer comprising the water-soluble polymer material.

13. The manufacturing method of claim 12, wherein the forming of the capping layer includes removing the capping material coated on the peripheral area and the pixel area by disposing a mask on the substrate and by using an exposure and developing process.

14. The manufacturing method of claim 13, wherein the capping layer is formed in a matrix pattern in the display area.

15. The manufacturing method of claim 12, wherein the water-soluble polymer material includes at least one of polyvinyl alcohol (PVA), methoxypolyethylene glycol, polyethylene glycol, polyethylene glycol diacrylate, polyethylene glycol dimethacrylate, and polyvinylpyrrolidone.

16. The manufacturing method of claim 15, wherein the light-blocking material includes a water-soluble black dye or a black pigment.

17. The manufacturing method of claim 16, wherein the water-soluble black dye includes at least one of 2-naphthalenesulfonic acid, trisodium 6-[(7-amino-1-hydroxy-3-sulphonato-2-naphthyl)azo]-3-4-4-amino-6or 7sulphonatonaphthyl-azo-phenyl -azo-4-hydroxynaphthalene-2-sulphonate, trisodium 4-amino-3-[[4-[[4-[(2-amino-4-hydroxyphenyl)azo]phenyl]amino]-3-sulphonatophenyl]azo]-5-hydroxy-6-(phenylazo)naphthalene-2,7-disulphonate, and disodium 4-amino-3,6-bis[[4-[(2,4-diaminophenyl)azo]phenyl]azo]-5-hydroxynaphthalene-2, 7-disulphonate 2,7-naphthalenedisulfonic acid.

18. The manufacturing method of claim 17, wherein the photosensitive material includes at least one of ammonium dichromate, a diazo resin, a styrylpyridium group, and a stilbazolium group.

19. The manufacturing method of claim 12, wherein the liquid crystal injection portions are formed to extend in a direction that is parallel with a gate line connected to the thin film transistor.

* * * * *